United States Patent
Park et al.

(10) Patent No.: US 7,639,529 B2
(45) Date of Patent: Dec. 29, 2009

(54) NON-VOLATILE MEMORY DEVICES THAT UTILIZE MIRROR-IMAGE PROGRAMMING TECHNIQUES TO INHIBIT PROGRAM COUPLING NOISE AND METHODS OF PROGRAMMING SAME

(75) Inventors: Ki Tae Park, Gyeonggi-do (KR); Jung Dal Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 379 days.

(21) Appl. No.: 11/567,865

(22) Filed: Dec. 7, 2006

(65) Prior Publication Data

US 2007/0195597 A1   Aug. 23, 2007

(30) Foreign Application Priority Data

Feb. 22, 2006   (KR)   ...................... 10-2006-0017142

(51) Int. Cl.
  *G11C 16/04*   (2006.01)
(52) U.S. Cl. ................................. 365/185.03
(58) Field of Classification Search ............ 365/185.03
  See application file for complete search history.

(56) References Cited

U.S. PATENT DOCUMENTS

| | | | |
|---|---|---|---|
| 4,992,980 A * | 2/1991 | Park et al. | 365/185.16 |
| 6,522,580 B2 | 2/2003 | Chen et al. | |
| 6,781,877 B2 | 8/2004 | Cernea et al. | |
| 7,342,827 B2 * | 3/2008 | Park et al. | 365/185.12 |
| 7,366,033 B2 * | 4/2008 | Park et al. | 365/189.05 |
| 7,388,778 B2 * | 6/2008 | Hwang | 365/185.03 |
| 2004/0057285 A1 | 3/2004 | Cernea et al. | |
| 2005/0232024 A1 * | 10/2005 | Atir et al. | 365/189.04 |

* cited by examiner

*Primary Examiner*—VanThu Nguyen
(74) *Attorney, Agent, or Firm*—Myers Bigel Sibley & Sajovec

(57) ABSTRACT

Non-volatile memory devices have improved data storage reliability resulting from mirror-image programming techniques that operate to reduce coupling noise between adjacent memory cells within a memory array. The adjacent memory cells include a first pair of memory cells and a second pair of memory cells. A program control circuit is provided to support mirror-image programming of the first and second pairs of memory cells when the two pairs of memory cells are storing the same 3-bit data.

12 Claims, 16 Drawing Sheets

$\Delta VC12 > \Delta VC23,$
$\Delta VM12 > \Delta VM23$

| | COUPLING NOISE IN WORST CASE |
|---|---|
| EMBODIMENT OF THE PRESENT INVENTION | $k\Delta VC23 + k\Delta VC12$ |
| FIRST COMPARED EXAMPLE | $k\Delta VC13 + k\Delta VC12$ |
| SECOND COMPARED EXAMPLE | $k\Delta VC13 + k\Delta VC12$ |
| THIRD COMPARED EXAMPLE | $k\Delta VC13 + k\Delta VC12$ |

NON-VOLATILE MEMORY DEVICES THAT UTILIZE MIRROR-IMAGE PROGRAMMING TECHNIQUES TO INHIBIT PROGRAM COUPLING NOISE AND METHODS OF PROGRAMMING SAME

REFERENCE TO PRIORITY APPLICATION

This application claims priority to Korean Application No. 2006-17142, filed Feb. 22, 2006, the disclosure of which is hereby incorporated herein by reference.

FIELD OF THE INVENTION

The present invention relates to integrated circuit memory devices and, more particularly, to nonvolatile memory devices and methods of programming nonvolatile memory devices.

BACKGROUND OF THE INVENTION

One class of nonvolatile memory devices includes electrically erasable programmable read only memory (EEPROM), which may be used in many applications including embedded applications and mass storage applications. In typical embedded applications, an EEPROM device may be used to provide code storage in personal computers or mobile phones, for example, where fast random access read times may be required. Typical mass storage applications include memory card applications requiring high capacity and low cost.

One category of EEPROM devices includes NAND-type flash memories, which can provide a low cost and high capacity alternative to other forms of nonvolatile memory. FIG. 1A illustrates a conventional flash memory array 10 having a plurality of NAND-type strings therein. Each of these NAND-type strings includes a plurality of EEPROM cells, which are associated with respective even and odd bit lines (BL0_e, BL0_o, . . . , BLn_e, BLn_o). These bit lines are connected to a page buffer 12 having a plurality of buffer circuits (PB0, . . . , PBn) therein. Each EEPROM cell includes a floating gate electrode and a control gate electrode, which is electrically connected to a respective word line (WL0, WL1, . . . , WLn). Access to each NAND string is enabled by driving a string select line (SSL) to a logic 1 voltage during reading and programming operations. Each NAND string also includes a respective ground select transistor, which is electrically connected to a ground select line (GSL).

As illustrated by FIG. 1B, the EEPROM cells within the flash memory array 10 of FIG. 1A may be cells that support a single programmed state. EEPROM cells that support only a single programmed state are typically referred to as single level cells (SLC). In particular, an SLC may support an erased state, which may be treated as a logic 1 storage value, and a programmed state, which may be treated as a logic 0 storage value. The SLC may have a negative threshold voltage (Vth) when erased (e.g., $-3V<Vth<-1V$) and a positive threshold voltage when programmed (e.g., $1V<Vth<3V$). This programmed state may be achieved by setting the bit line BL to a logic 0 value (e.g., 0 Volts), applying a program voltage (Vpgm) to a selected EEPROM cell and applying a pass voltage (Vpass) to the unselected EEPROM cells within a string, as illustrated by FIG. 1C. In addition, during programming the NAND string may be enabled by applying a positive voltage (e.g., power supply voltage Vdd) to the string select line (SSL) and a ground voltage (e.g., 0 Volts) to the ground select line (GSL).

Moreover, the programmed state or erased state of an EEPROM cell may be detected by performing a read operation on a selected cell. As illustrated by FIG. 1D, a NAND string will operate to discharge a precharged bit line BL when a selected cell is in an erased state and the selected word line voltage (e.g., 0 Volts) is greater than the threshold voltage of the selected cell. However, when a selected cell is in a programmed state, the corresponding NAND string will provide an open circuit to the precharged bit line BL because the selected word line voltage (e.g., 0 Volts) is less than the threshold voltage of the selected cell and the selected cell remains "off". Other aspects of NAND-type flash memories are disclosed in an article by Jung et al., entitled "A 3.3 Volt Single Power Supply 16-Mb Nonvolatile Virtual DRAM Using a NAND Flash Memory Technology," IEEE Journal of Solid-State Circuits, Vol. 32, No. 11, pp. 1748-1757, November (1997), the disclosure of which is hereby incorporated herein by reference.

EEPROM cells that support multiple programmed states are typically referred to as multi-level cells (MLC). As illustrated by FIG. 2, an MLC that supports an erased state and three different programmed states operates to store two data bits per cell. These and other aspects of an MLC having two data bits per cell is disclosed in an article by Takeuchi et al., entitled "A Multipage Cell Architecture for High-Speed Programming Multilevel NAND Flash Memories," IEEE Journal of Solid-State Circuits, Vol. 33, No. 8, pp. 1228-1238, August (1998). Commonly assigned U.S. Pat. Nos. 5,862,074 and 5,768,188 also disclose aspects of multi-level EEPROM cells arranged in a NAND-type configuration, the disclosures of which are hereby incorporated herein by reference.

FIGS. 3A-3B illustrate how a pair of three-state EEPROM cells may support 3-bit programming. In FIG. 3A, an MLC is illustrated as supporting an erased state and two possible programmed states. As will be understood by those skilled in the art, the erased state may be distinguished from the two possible programmed states by applying a first reference voltage VR1 to a control electrode of a selected EEPROM cell during a read operation. This first reference voltage VR1 should be set to a level between the maximum acceptable threshold voltage of an erased cell (shown as V0) and the minimum acceptable threshold voltage of a cell programmed to state 1 (shown as V1). Similarly, the second programmed state (state 2) may be distinguished from the erased and first programmed states by applying a second reference voltage VR2 to a selected EEPROM cell during a read operation. This second reference voltage VR2 should be set to a level between the maximum acceptable threshold voltage of a cell programmed to state 1 and the minimum acceptable threshold voltage of a cell programmed to state 2 (shown as V2). As illustrated by FIG. 3B, two adjacent three-level EEPROM cells in the same physical row of memory may be programmed into one of eight possible states ((111), (110), . . . , (001), (000)) to support 3-bits of data per cell pair. Additional aspects of three-state EEPROM cells are disclosed in an article by Tanaka et al., entitled "A 3.4-Mbyte/sec Programming 3-Level NAND Flash Memory Saving 40% Die Size Per Bit," 1997 Symposium on VLSI Circuits Digest of Technical Papers, Section 9.3, pp. 65-66 (1997). Unfortunately, the use of 3-state EEPROM cells in the pair configuration of FIG. 3B may require the use of complex error detection and correction circuitry because any single cell failure will typically result in a corresponding 3-bit data error for both cells in the corresponding pair.

SUMMARY OF THE INVENTION

Embodiments of the present invention include non-volatile memory devices having improved data storage reliability resulting from mirror-image programming techniques that operate to reduce coupling noise between adjacent memory cells. According to some of these embodiments, a non-volatile memory device includes a memory array having a plurality of rows and columns of non-volatile memory cells therein. These memory cells may be three-state memory cells that can be paired to provide 3-bit data per pair. The memory cells may also be arranged in a NAND-type structure, with each pair of non-volatile memory cells sharing a common word line. In particular, the memory array includes at least one row of three-state memory cells therein that are grouped in pairs to provide 3-bit data storage. The at least one row includes a first pair of left and right non-volatile memory cells extending immediately adjacent a second pair of left and right non-volatile memory cells.

The memory device also includes a program control circuit electrically coupled to the memory array. This program control circuit may include, among other things, a row decoder/driver that drives word lines in the memory array and a page buffer that drives bit lines in the memory array. The program control circuit is configured to support mirror image programming of the first and second pairs of non-volatile memory cells. According to this mirror-image programming, the threshold voltages in the left and right non-volatile memory cells of the first pair are programmed as mirror-images of the threshold voltages in the left and right non-volatile memory cells of the second pair whenever: (i) the first and second pairs of non-volatile memory cells are storing the same 3-bit data containing at least one programmed bit; and (ii) the threshold voltages of the left and right non-volatile memory cells in each of the first and second pairs of non-volatile memory cells are unequal.

Additional embodiments of the present invention include methods of programming non-volatile memory arrays by programming first and second pairs of immediately adjacent 3-level non-volatile memory cells within a row of the non-volatile memory array so that the threshold voltages in left and right non-volatile memory cells of the first pair are mirror-images of the threshold voltages in left and right non-volatile memory cells of the second pair whenever: (i) the first and second pairs of non-volatile memory cells are storing the same 3-bit data containing at least one programmed bit; and (ii) the threshold voltages of the left and right non-volatile memory cells in each of the first and second pairs of non-volatile memory cells are unequal.

Another embodiment of the invention includes a memory array having first to fourth bit lines being sequentially arranged and a page buffer coupled to the memory array. The page buffer is configured to operate so as to map first to third bits of a first group to a first memory cell and a second memory cell of a first pair and map first to third bits of a second group to a first memory cell and a second memory cell of a second pair. According to this mapping, the threshold voltage level of the first memory cell of the first pair is controlled according to the first bit of the first group, and the threshold voltage level of the second memory cell of the second pair is controlled according to the first bit of the second group. A row decoder is also provided. This row decoder is configured to control a word line of a selected memory cell of the memory array. The first to the third bits of the first and the second groups are sequentially programmed. The first memory cell of the first pair is connected to the second bitline, the second memory cell of the first pair is connected to the first bitline, the first memory cell of the second pair is connected to the third bitline, and the second memory cell of the second pair is connected to the fourth bitline.

A programming method according to embodiments of the invention include: (A) a step of controlling the threshold voltage of a first memory cell of a first pair as a first threshold group depending on first bit data of a first group, and controlling the threshold voltage of a first memory cell of a second pair as the first threshold group depending on first bit data of a second group; (B) a step of controlling one of the first memory cell and a second memory cell of the first pair as a third threshold group according to the combined second bit data of the first group and the threshold voltage of the first memory cell of the first pair programmed at step (A). The method also includes controlling one of the first memory cell and a second memory cell of the second pair as a third threshold group depending on the combined second bit data of the second group and the threshold voltage of the first memory cell of the second pair programmed at step (A). A step (C) is also provided. This step includes controlling the other one of the first memory cell and the second memory cell of the first pair as a second threshold group according to the combined third bit data of the first group and the threshold voltages of the first memory cell and the second memory cell of the first pair programmed at step (B).

BRIEF DESCRIPTION OF THE DRAWINGS

FIG. 13 is a table showing the worst case coupling noises for the embodiment of FIG. 7A and the comparative examples of FIGS. 10-12.

DESCRIPTION OF THE PREFERRED EMBODIMENTS

Figure 1A:
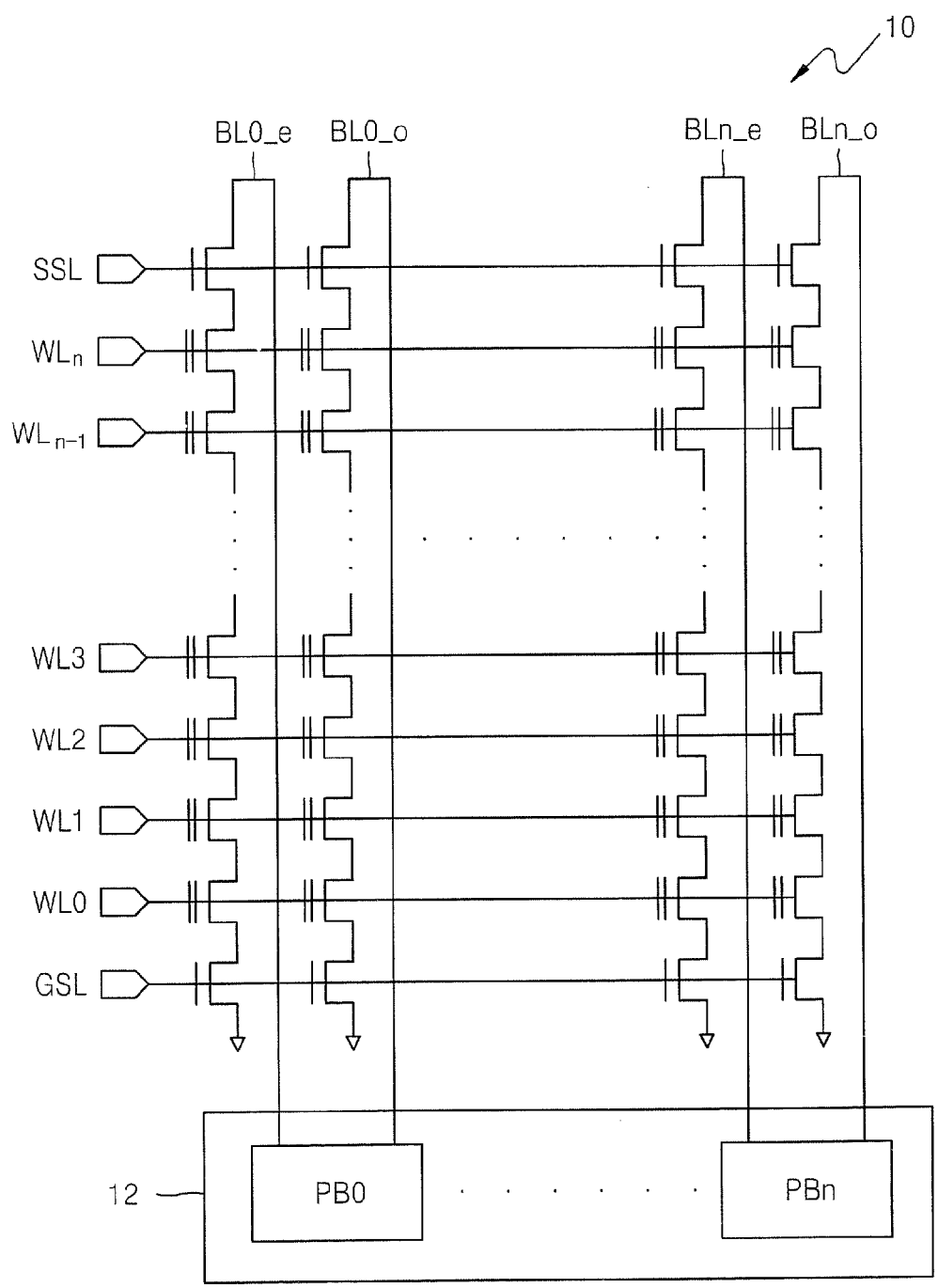
FIG. 1A is an electrical schematic of a conventional non-volatile memory device having NAND-type strings of EEPROM cells therein.
Figure 1B:
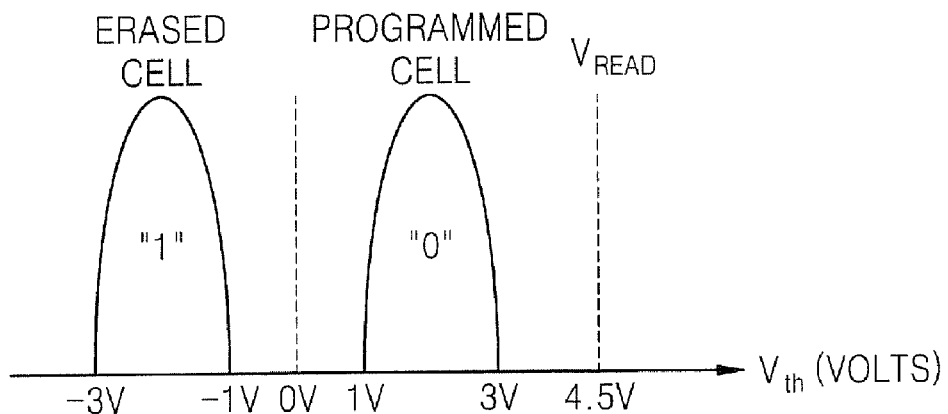
FIG. 1B is a graph illustrating the relative threshold voltages of an erased and programmed EEPROM cell, according to the prior art.
Figure 1C:
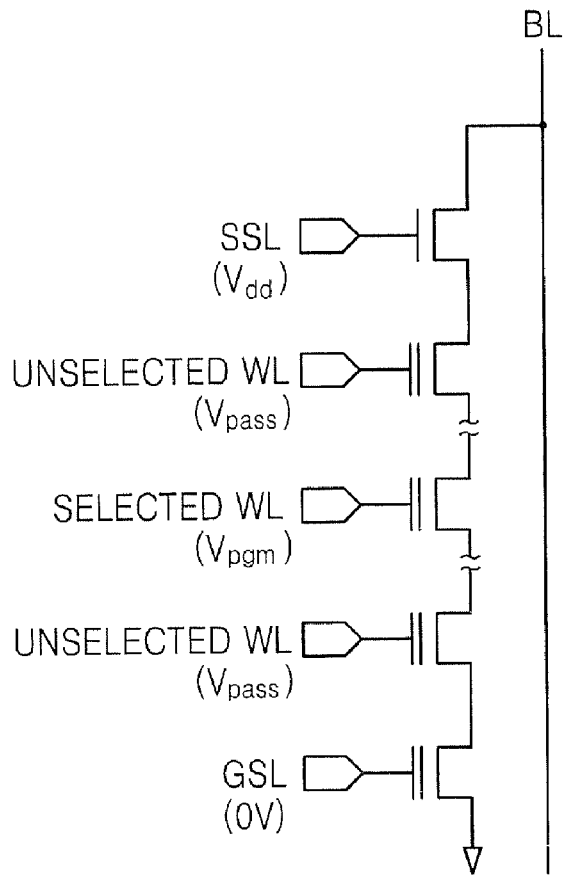
FIG. 1C is an electrical schematic of a NAND-type string of EEPROM cells showing programming bias conditions.
Figure 1D:
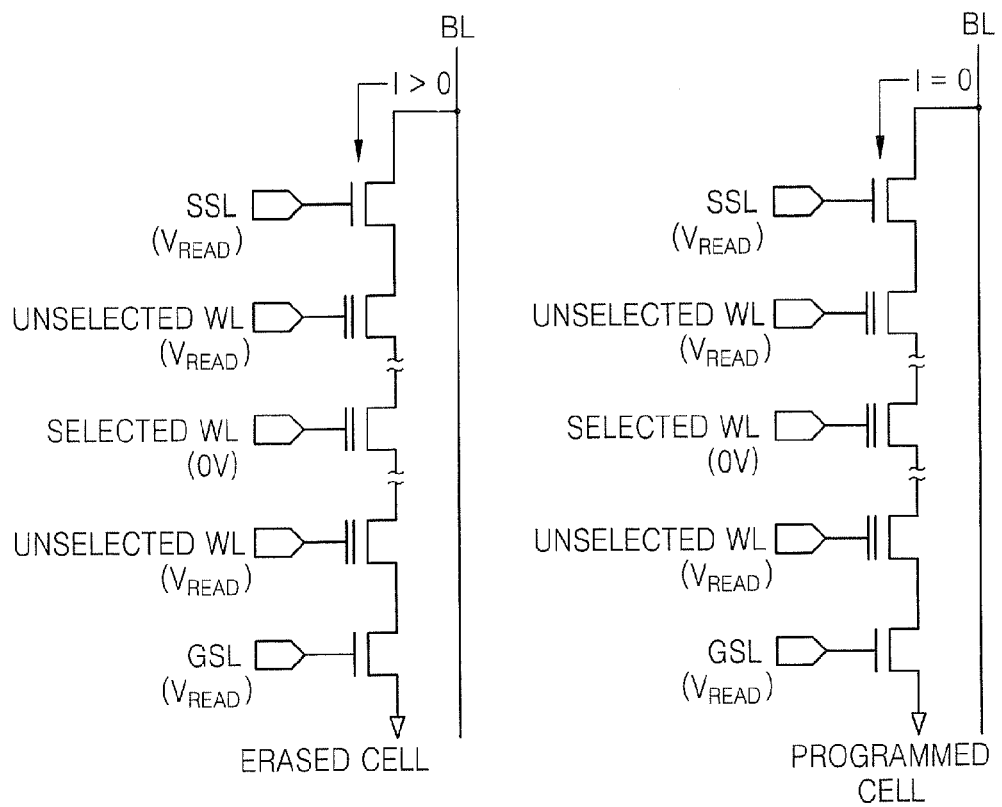
FIG. 1D illustrates current flow in a NAND-type string during operations to read data from an erased EEPROM cell and a programmed EEPROM cell according to the prior art.
Figure 2:
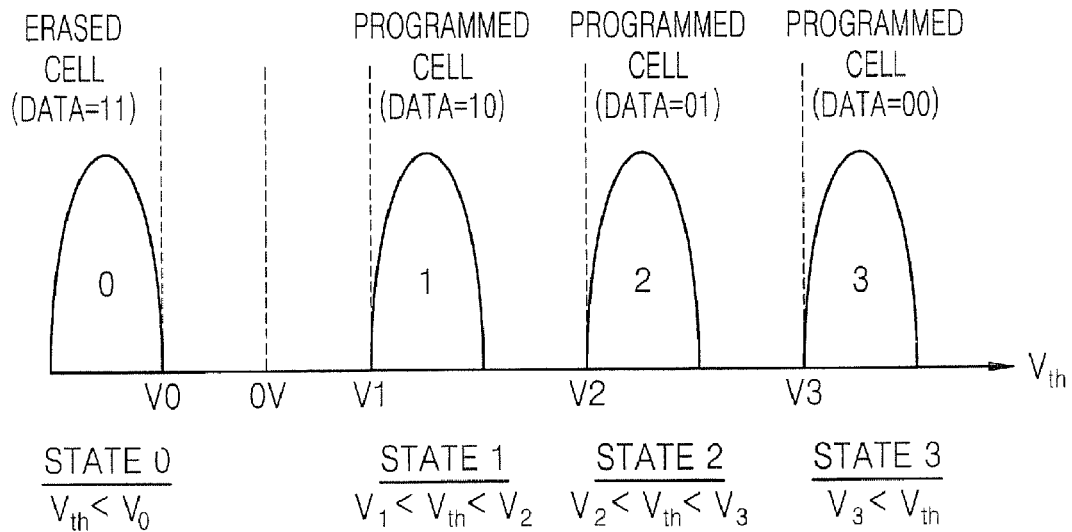
FIG. 2 is a graph illustrating the relative threshold voltages of a four-state EEPROM cell according to the prior art.
Figure 3A:
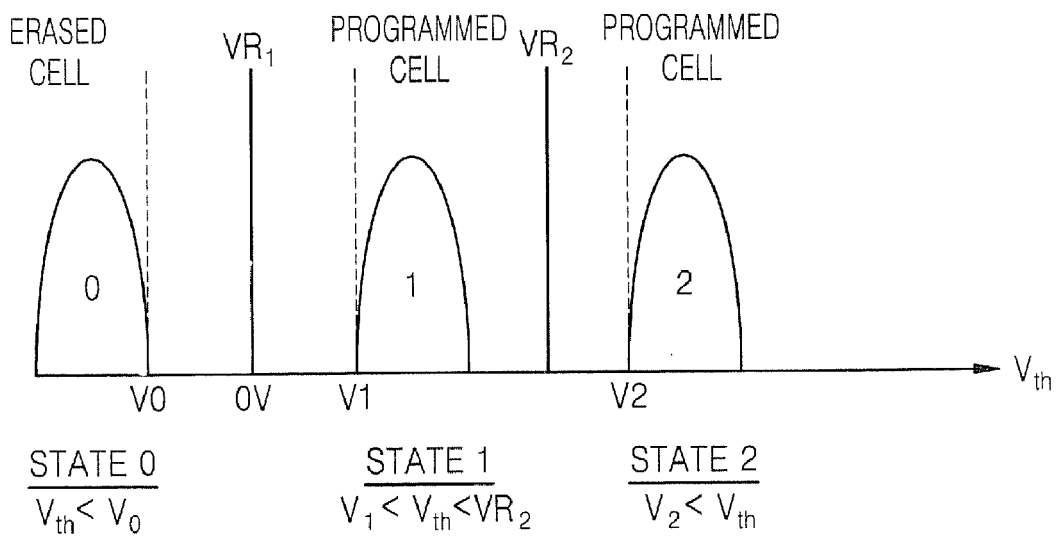
FIG. 3A is a graph illustrating the relative threshold voltages of a three-state EEPROM cell according to the prior art.
Figure 3B:
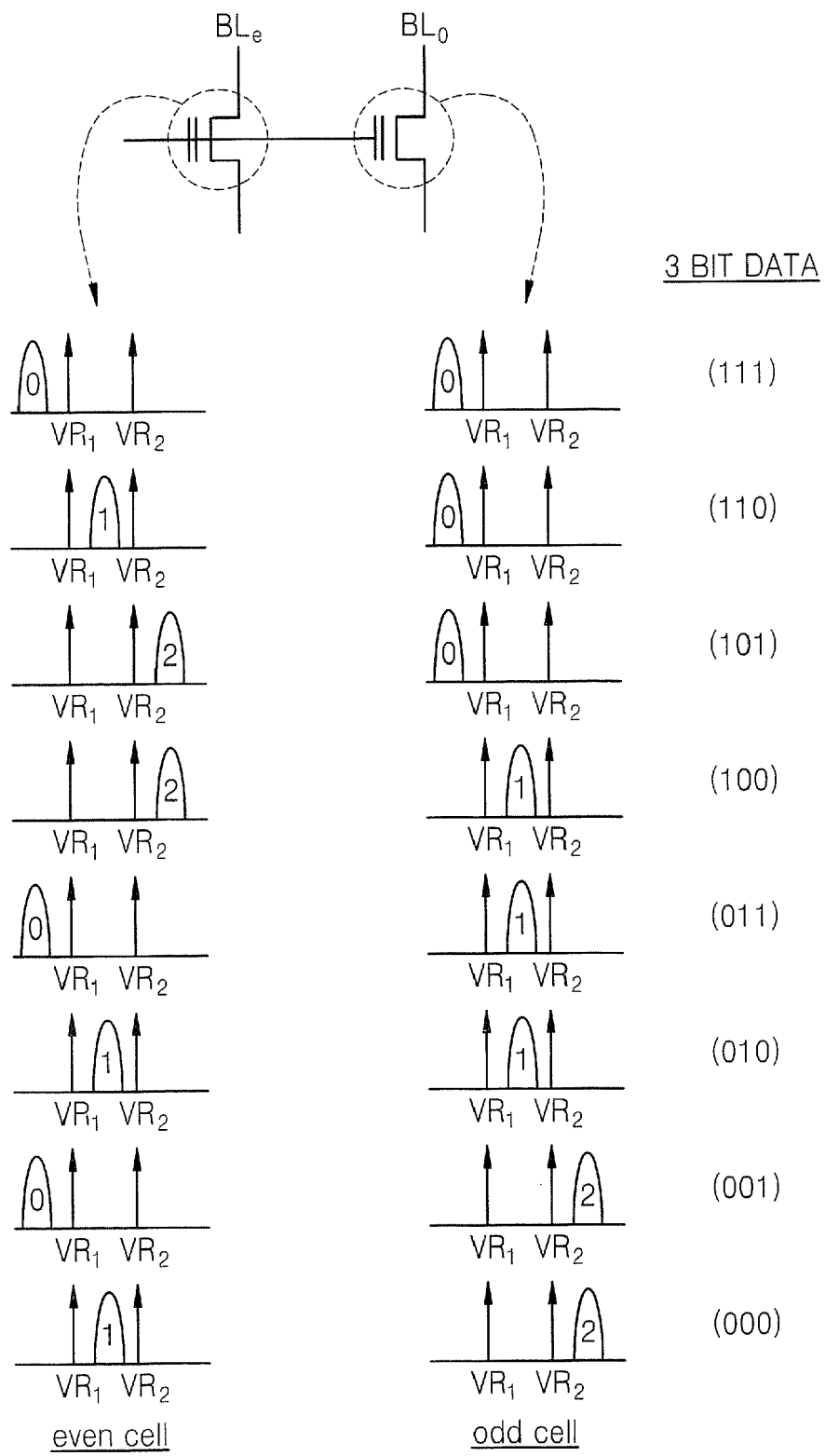
FIG. 3B illustrates the threshold voltage distributions of two adjacent three-state EEPROM cells that support 3-bit data when paired together in the same row of memory.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor Boolean operations (e.g., inversion) without being considered different signals.

Figure 4:
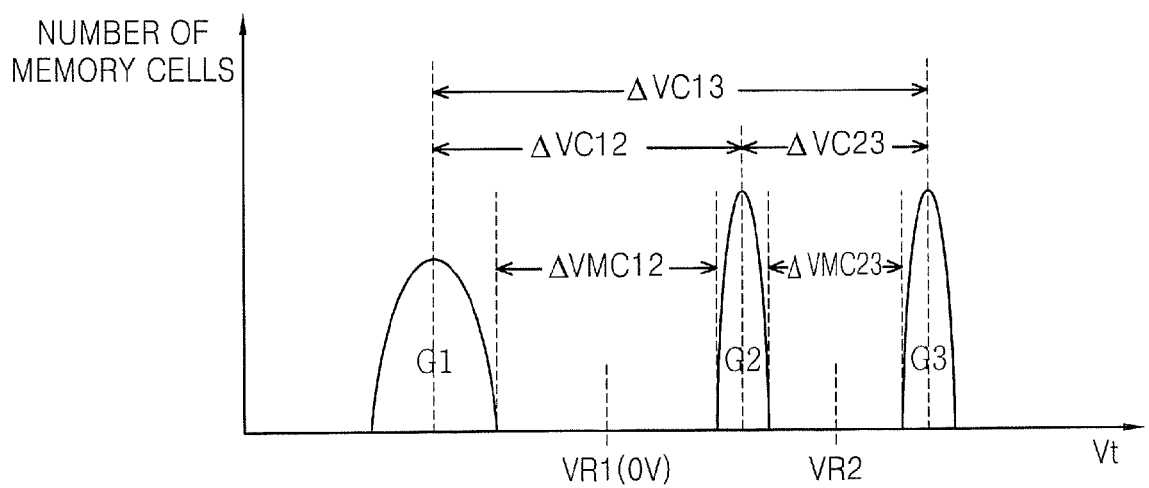
FIG. 4 is a view showing the distribution of threshold voltages in a typical 3-level memory cell.

As shown in FIG. 4, a 3-level memory cell (MC) has three kinds of threshold voltage groups. The threshold voltage groups of the memory cells MCs can be classified based on a first reference voltage VR1 and a second reference voltage VR2. A threshold voltage group having threshold voltages lower than the first reference voltage VR1 is designated as a "first threshold voltage group G1", and a threshold voltage group having threshold voltages between the first reference voltage VR1 and the second reference voltage VR2 is designated as a "second threshold voltage group G2". Further, a threshold voltage group having threshold voltages higher than the second reference voltage VR2 is designated as a "third threshold voltage group G3".

In a 3-level non-volatile semiconductor memory device, two immediately adjacent memory cells in a same row form a pair. And, 3 bits of data may be stored in the two memory cells forming a pair. The 3-level memory cell has a larger number of data storage states compared to a 2-level memory cell, which means a 3-level memory cell may support a higher degree of integration relative to a 2-level memory cell. Furthermore, for the 3-level memory cell, the interval between threshold voltage levels is larger than that of a 4-level memory cell. Thus, a memory device with 3-level memory cells may have higher reliability than a memory device with 4-level memory cells. Accordingly, the 3-level non-volatile semiconductor memory device may be advantageous in terms of integration and reliability.

In the 3-level memory cells of FIG. 4, the first reference voltage VR1 is set with the ground voltage VSS, for convenience of control. The margin $\Delta VM12$ between the first threshold voltage group G1 and the second threshold voltage group G2 is wider than the margin $\Delta VM23$ between the second threshold voltage group G2 and the third threshold voltage group G3. Furthermore, the voltage difference $\Delta VC12$ between the first threshold voltage group G1 and the second threshold voltage group G2 is larger than the voltage difference $\Delta VC23$ between the second threshold voltage group G2 and the third threshold voltage group G3.

Figure 5:
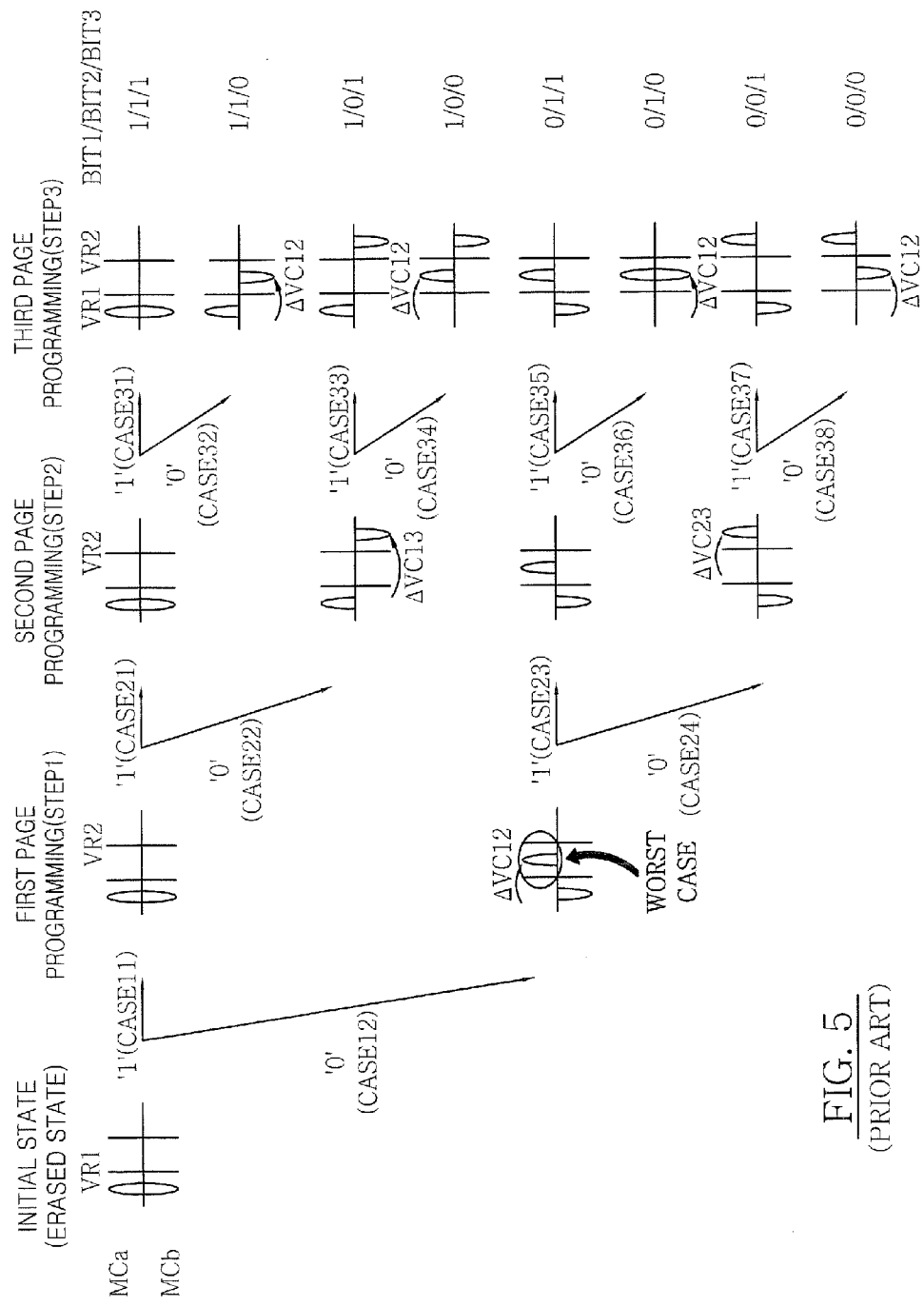
FIG. 5 schematically illustrates operations to program 3-bits of data into two adjacent memory cells within a non-volatile memory array.

FIG. 5 shows a method of programming 3-level memory cells forming a pair. The 3-level memory cells forming a pair are referred to as a first memory cell MCa and a second memory cell MCb. Referring to FIG. 5, the programming of a pair of memory cells is performed in the sequence of first to third page programming operations STEP1 to STEP3 respectively using first to third bits BIT1 to BIT3.

First, in an erased state which is an initial state, all of the threshold voltages of the first and second memory cells MCA and MCB are located at the first threshold voltage group G1. In the first page programming operation STEP1, the threshold voltage of the first memory cell MCa is controlled as a first threshold group G1 depending on the first bit data BIT1. That is to say, when the first bit data BIT1 is "1" (CASE11), all of the threshold voltages of the first and second memory cells MCa and MCb are maintained at the erase state, that is, at the first threshold voltage group G1.

But, when the first bit data BIT1 is "0" (CASE12), the threshold voltage of the first memory cell MCa is adjusted to the second threshold voltage group G2, and the threshold voltage of the second memory cell MCb is maintained at the first threshold voltage group G1. At this time, the threshold voltage of the first memory cell MCa is changed by the amount of $\Delta VC12$.

In the second page programming operation STEP2, the threshold voltage of the first memory cell MCa or the second memory cell MCb is controlled as the third threshold group G3 depending on the second bit data BIT2. That is to say, when all of the first bit data BIT1 and the second bit data BIT2 are "1" (CASE21), all of the threshold voltages of the first and second memory cells MCa and MCb are maintained at an erase state, that is, at the first threshold voltage group G1.

But, when the first bit data BIT1 is "1" and the second bit data BIT2 is "0" (CASE22), the threshold voltage of the first memory cell MCa is maintained at the first threshold voltage group G1, and the threshold voltage of the second memory cell MCb is adjusted to the third threshold voltage group G3. At this time, the threshold voltage of the second memory cell MCb is changed by the amount of $\Delta VC13$.

When the first bit data BIT1 is "0" and the second bit data BIT2 is "1" (CASE23), the threshold voltage of the first memory cell MCa is maintained at the second threshold voltage group G2, and the threshold voltage of the second memory cell MCb is maintained at the first threshold voltage group G1.

Alternatively, when all of the first bit data BIT1 and the second bit data BIT2 are "0" (CASE24), the threshold voltage of the first memory cell MCa is adjusted to the third threshold voltage group G3, and the threshold voltage of the second memory cell MCb is maintained at the first threshold voltage group G1. At this time, the threshold voltage of the first memory cell MCa is changed by the amount of $\Delta VC23$.

In the third page programming operation STEP3, the threshold voltage of the first memory cell MCa or the second memory cell MCb is controlled as the second threshold group G2 depending on the value of second bit data BIT3.

That is to say, when all of the first bit data BIT1, the second bit data BIT2 and the third bit data BIT3 are "1" (CASE31), all of the threshold voltages of the first and second memory cells MCa and MCb are maintained at an erase state, that is, at the first threshold voltage group G1. Thus, when the first bit data BIT1 is "1", the second bit data BIT2 is "1" and the third bit data BIT3 is "0" (CASE32), the threshold voltage of the first memory cell MCa is maintained at the first threshold voltage group G1, and the threshold voltage of the second memory cell MCb is adjusted to the second threshold voltage group G2. At this time, the threshold voltage of the second memory cell MCb is changed by the amount of $\Delta VC12$.

When the first bit data BIT1 is "1", the second bit data BIT2 is "0" and the third bit data BIT3 is "1" (CASE33), the threshold voltage of the first memory cell MCa is maintained at the first threshold voltage group G1, and the threshold voltage of the second memory cell MCb is maintained at the third threshold voltage group G3. But, when the first bit data BIT1 is "1", the second bit data BIT2 is "0" and the third bit data BIT3 is "0" (CASE34), the threshold voltage of the first memory cell MCa is adjusted to the second threshold voltage group G2, and the threshold voltage of the second memory cell MCb is maintained at the third threshold voltage group G3. At this time, the threshold voltage of the first memory cell MCa is changed by the amount of $\Delta VC12$.

When the first bit data BIT1 is "0", the second bit data BIT2 is "1" and the third bit data BIT3 is "1" (CASE35), the threshold voltage of the first memory cell MCa is maintained at the second threshold voltage group G2, and the threshold voltage of the second memory cell MCb is maintained at the first threshold voltage group G1. But, when the first bit data BIT1 is "0", the second bit data BIT2 is "1" and the third bit data BIT3 is "0" (CASE36), the threshold voltage of the first memory cell MCa is maintained at the second threshold voltage group G2, and the threshold voltage of the second memory cell MCb is adjusted to the second threshold voltage group G2. At this time, the threshold voltage of the second memory cell MCb is changed by the amount of $\Delta VC12$.

When the first bit data BIT1 is "0", the second bit data BIT2 is "0" and the third bit data BIT3 is "1" (CASE37), the threshold voltage of the first memory cell MCa is maintained at the third threshold voltage group G3, and the threshold voltage of the second memory cell MCb is maintained at the first threshold voltage group G1.

But, when all of the first bit data BIT1, the second bit data BIT2 and the third bit data BIT3 are "0" (CASE38), the threshold voltage of the first memory cell MCa is maintained at the third threshold voltage group G3, and the threshold voltage of the second memory cell MCb is adjusted to the second threshold voltage group G2. At this time, the threshold voltage of the second memory cell MCb is changed by the amount of $\Delta VC12$.

When the non-volatile semiconductor memory device is operated with the programming method shown in FIG. 5, a worst case condition may occur to the first memory cell Mca, which is programmed to the second threshold voltage group G2 in the first page programming operation STEP1, considering the margins between the threshold voltage groups. That is, the first memory cell MCa, which is programmed to the second threshold voltage group G2 in the first page programming operation STEP1, may be under the influence of coupling noise, when an adjacent memory cell is programmed in the first or the second page programming operation STEP2 or STEP3. In the case that the coupling noise is large, the margin ($\Delta VM23$, referring to FIG. 4) between the second threshold voltage group G2 and the third threshold voltage group G3 may be reduced. As result, the non-volatile semiconductor memory device may operate incorrectly during a read operation.

Embodiments of the present invention are provided to decrease the coupling noise for the first memory cell MCa, which is programmed as the second threshold voltage group G2 in the first page programming operation STEP1.

Figure 6:
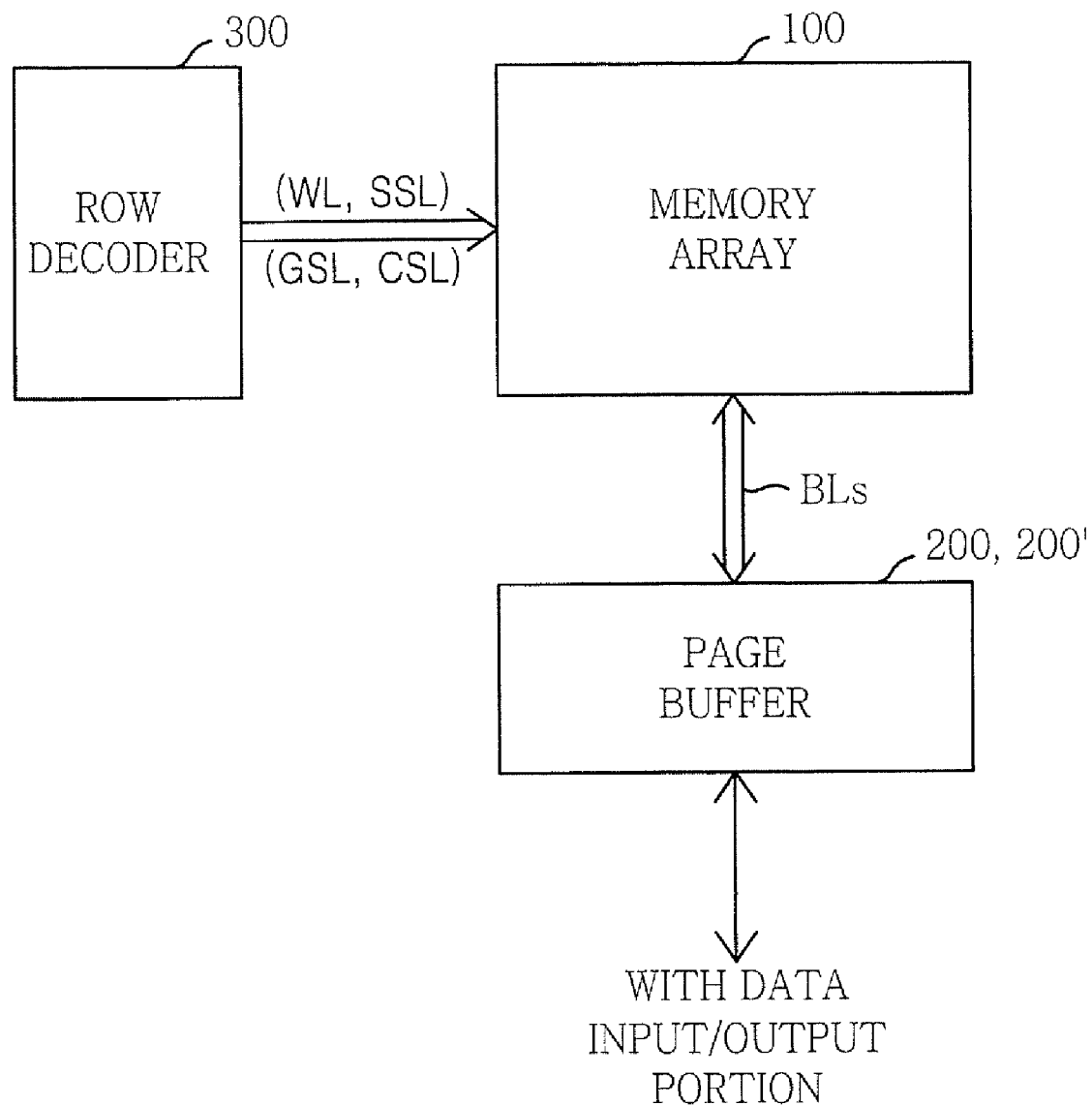
FIG. 6 is a block diagram of a non-volatile semiconductor memory device according to an embodiment of the present invention.

FIG. 6 is a diagram showing the non-volatile semiconductor memory device according to an embodiment of the present invention. In FIG. 6, a memory array 100, a page buffer 200, and a row decoder 300 are shown. The memory array 100 includes a plurality of non-volatile memory cells arranged in a matrix stricture of rows and columns. The page buffer 200 is coupled to the memory array 100. The page buffer 200 is driven to map the first to third bit data BIT1<1> to BIT3<1> of the first group to the threshold voltage groups of first and second memory cells MCa<1> and MCb<1> of the first pair. Herein, the first to third bit data BIT1<1> to BIT3<1> are sequentially programmed. At this time, the threshold voltage group of the first memory cell MCa<1> of the first pair is controlled depending on the first bit data BIT1<1> of the first group. And, The page buffer 200 is further driven to map the first to third bit data BIT1<2> to BIT3<2> of the second group to the threshold voltage groups of first and second memory cells MCa<2> and MCb<2> of the second pair. Herein, the first to third bit data BIT1<2> to BIT3<2> are sequentially programmed. At this time, the threshold voltage group of the first memory cell MCa<2> of the second pair is controlled depending on the first bit data BIT1<1> of the second group. The row decoder 300 is operated to control a selected word line WL, a string selection signal SSL, a ground selection signal GSL and a common source line CSL.

Figure 7A:
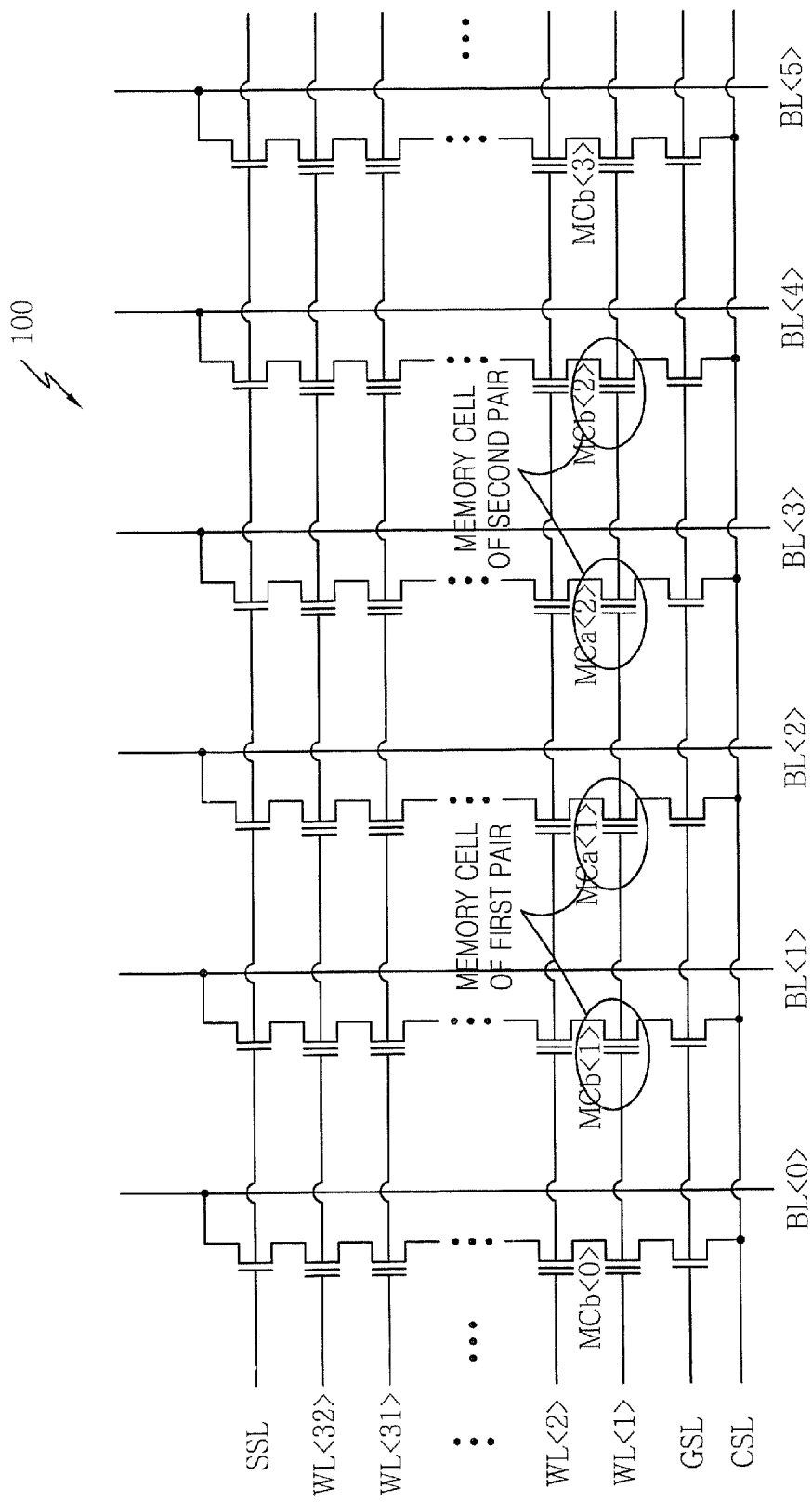
FIG. 7A is an electrical schematic of a portion of the memory array of FIG. 6, which shows NAND-type non-volatile memory cells.

FIG. 7A is a diagram showing part of the memory array 100 of FIG. 6. The memory array shown in FIG. 7A is a NAND-type non-volatile semiconductor memory device containing EEPROM cells. As shown in FIG. 7A, the memory array 100 includes first to fourth bitlines BL<1> to BL<4>, which are sequentially arranged. In this embodiment, the first memory cell MCa<1> of the first pair is connected to the second bitline BL<2>, and the second memory cell MCb<1> of the first pair is connected to the first bitline BL<1>. The first memory cell MCa<2> of the second pair is connected to the third bitline BL<3>, and the second memory cell MCb<2> of the second pair is connected to the fourth bitline BL<4>. The first and the second memory cell MCa<1> and MCb<1> of the first pair and the first and the second memory cell MCa<2> and MCb<2> of the second pair are controlled by the same word-line (e.g., WL<1>). In the embodiment of FIG. 7A, at the left side of the first memory cell MCa<1> of the first pair is the second memory cell MCb<1> of the first pair. And, at the right side of the first memory cell MCa<1> of the first pair is the first memory cell MCa<2> of the second pair. Based on this configuration, the coupling noise of the first memory cell MCa, which is programmed in the first program step STEP1, may be decreased.

In this description, it is assumed that the first memory cell MCa<1> of the first pair is programmed in the first page program operation STEP1. Then, the worst case of the second page program operation STEP2 may happen when the first memory cell MCa<2> of the second pair is controlled from the second threshold voltage group G2 to the third threshold voltage group G3. The first memory cell MCa<2> of the second pair is located adjacent and to the right of the first memory cell MCa<1> of the first pair, as described above. In this case, the coupling noise of the worst case is $k\Delta VC23$. Herein, k is a constant of a coupling noise relationship, which is generated due to the adjacent memory cell.

The change in the threshold voltage of the second memory cell MCb<2> of the second pair may be larger than that of the first memory cell MCa<2> of the second pair; however, because the second memory cell MCb<2> of the second pair is not adjacent to the first memory cell MCa<1> of the first pair, the coupling noise of the second memory cell MCb<2> of the second pair is smaller than that of the first memory cell MCa<2> of the second pair.

The worst case of the third page program operation STEP3 may happen when the second memory cell MCb<1> of the first pair is controlled from the first threshold voltage group G1 to the second threshold voltage group G2. In this case, the coupling noise of the worst case is kΔVC12. For the reference, the first memory cell MCa<2> of the second pair, which is controlled as the third threshold voltage group G3 in the worst case of the second page program operation STEP2, is not controlled in the third page program operation STEP3.

As a result, for the first memory cell MCa<1> of the first pair, the coupling noise of the worst case is the sum of kΔVC23 and kΔVC12. The coupling noise in the embodiment of FIG. 7A is relatively small compared with the coupling noise associated with the devices of FIGS. 10-12.

Figure 7B:
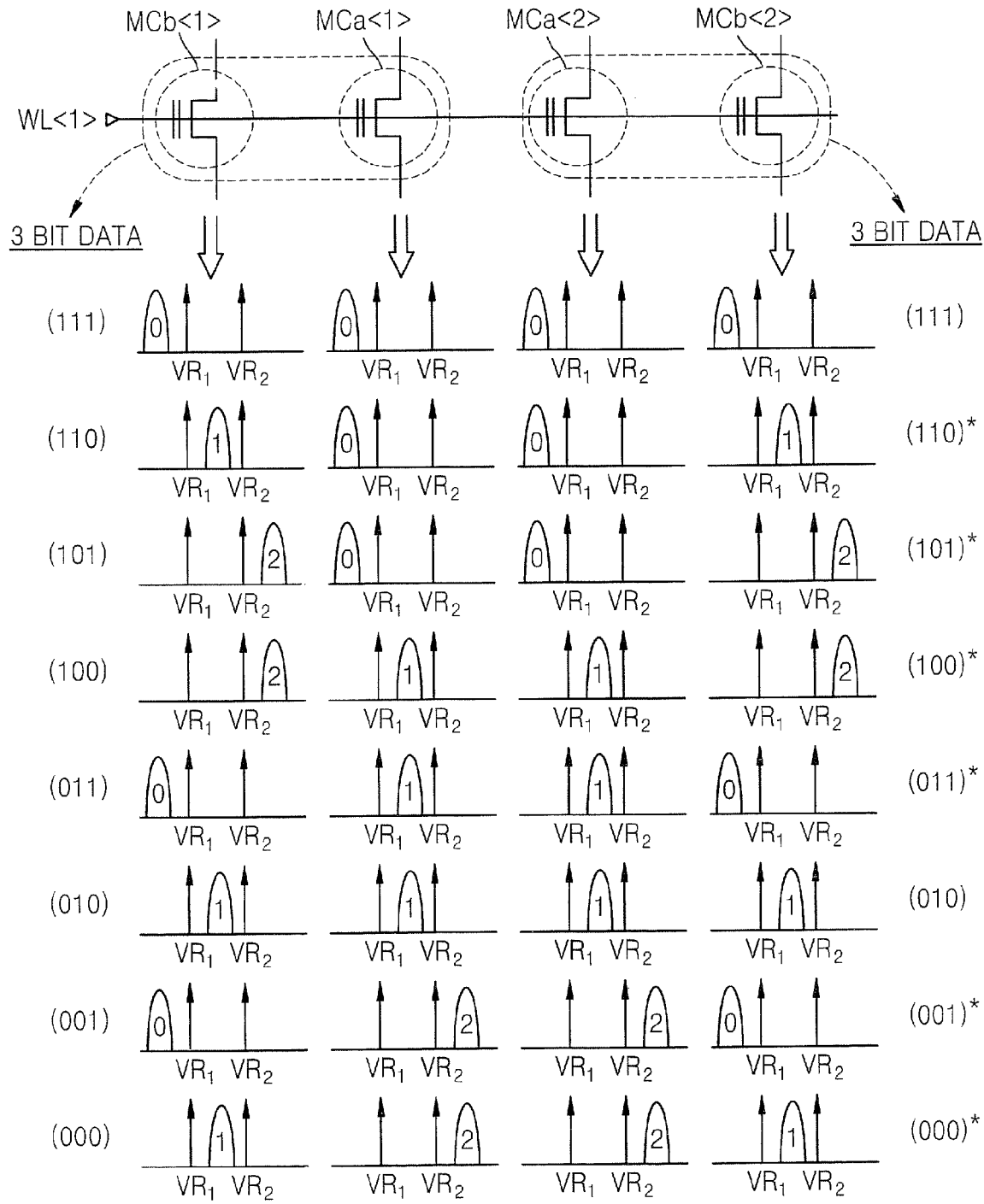
FIG. 7B is a diagram that illustrates programming characteristics of non-volatile memory cells according to embodiments of the invention.

FIG. 7B further illustrates how the first and second pairs of non-volatile memory cells: (MCa<1>, MCb<1>) and (MCa<2>, MCb<2>) are programmed according to embodiments of the present invention. As illustrated, these two pairs of non-volatile memory cells represent four immediately adjacent memory cells located within a common row of a memory array and electrically coupled to a common word line, shown as WL<1>. The first pair of non-volatile memory cells is arranged so that memory cell MCb<1> is located to the left of memory cell MCa<1>. The second pair of non-volatile memory cells is arranged so that memory cell MCb<2> is located to the right of memory cell MCa<2>. Accordingly, the memory cells MCa<1> and MCa<2> are located immediately adjacent to each other, with the first and second pairs of cells being arranged in a mirror-image position relative to each other.

Based on this configuration, FIG. 7B illustrates how the threshold voltages (represented by numerals 0, 1 or 2) in the left and right non-volatile memory cells of the first pair (MCb<1>, MCa<1>) are programmed as mirror-images of the threshold voltages in the left and right non-volatile memory cells of the second pair (MCa<2>, MCb<2>) whenever: (i) the first and second pairs of non-volatile memory cells are storing the same 3-bit data containing at least one programmed bit; and (ii) the threshold voltages of the left and right non-volatile memory cells in each of the first and second pairs of non-volatile memory cells are unequal. These two criteria are met for the following six cases of three-bit data (shown by "*"): (110), (101), (100), (011), (001) and (000).

Furthermore, as illustrated by FIGS. 6 and 7A-7B, a program control circuit may be provided for programming the memory array. This program control circuit may include, among other things, the row decoder/driver 300, which drives word lines in the memory array 100, and the page buffer 200, which drives bit lines in the memory array 100. The program control circuit is configured to support mirror image programming of the first and second pairs of non-volatile memory cells (shown in FIG. 7A as (MCa<1>, MCb<1>) and (MCa<2>, MCb<2>)). According to this mirror-image programming, the threshold voltages in the left and right non-volatile memory cells of the first pair are programmed as mirror-images of the threshold voltages in the left and right non-volatile memory cells of the second pair whenever: (i) the first and second pairs of non-volatile memory cells are storing the same 3-bit data containing at least one programmed bit; and (ii) the threshold voltages of the left and right non-volatile memory cells in each of the first and second pairs of non-volatile memory cells are unequal.

Figure 8:
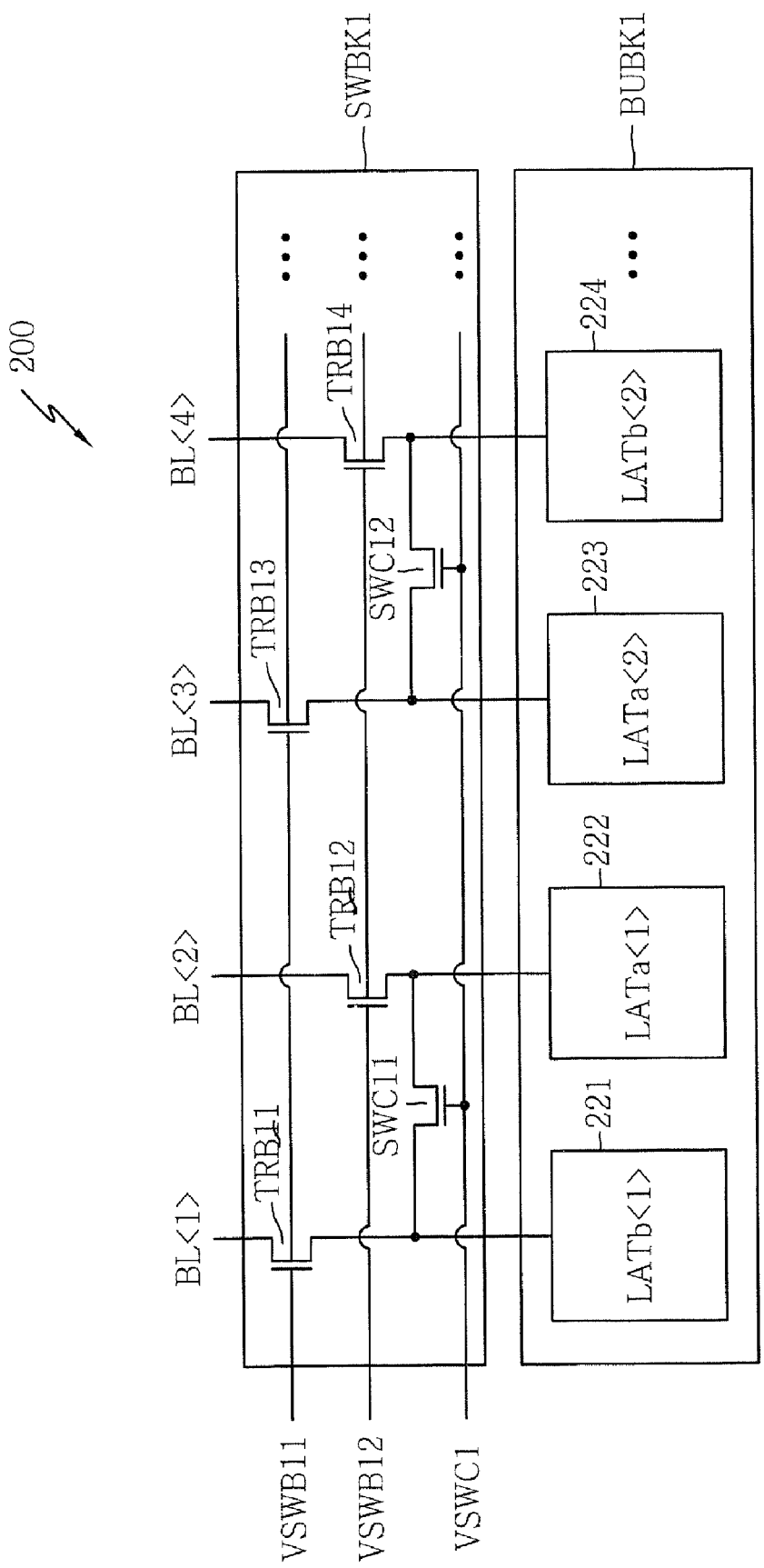
FIG. 8 is a circuit diagram showing one embodiment of the page buffer of FIG. 6.

FIG. 8 is a circuit diagram showing the page buffer 200 of FIG. 6 in detail. The page buffer 200 is operated to drive the memory array 100. Referring to FIG. 8, the page buffer 200 includes a buffer block BUBK1 and a switch block SWBK1. The buffer block BUBK1 is driven to provide a multiple data to the switch block SWBK1 during a program operation. The switch block SWBK1 is switched to correspondingly provide the data from the buffer block BUBK1 to the first to the fourth bitlines BL<1> to BL<4> during program operation.

The buffer block BUBK1 includes a first to fourth latches 221 to 224 being driven to latch the data during a program operation. Preferably, the second and the third latches 222 and 223 are driven to provide the latched data to the second and the third bitlines BL<2> and BL<3>, respectively, while the first bits of the first group and the second group are programmed.

The switch block SWBK1 includes first to fourth bitline switches TRB11 to TRB14, and further includes a first and a second connection switches SWC11 and SWC12. The first bitline switch TRB11 is switched to electrically connect the first latch 221 to the first bitline BL<1>, in response to a first bitline connection signal VSWB11. The second bitline switch TRB12 is switched to electrically connect the second latch 222 to the second bitline BL<2>, in response to a second bitline connection signal VSWB12. The third bitline switch TRB13 is switched to electrically connect the third latch 223 to the third bitline BL<3>, in response to the first bitline connection signal VSWB11. And, the fourth bitline switch TRB14 is switched to electrically connect the fourth latch 224 to the fourth bitline BL<4>, in response to the second bitline connection signal VSWB12. Accordingly, the multiple data of the first to fourth latches 221 to 224 may be transferred to first to fourth bitlines BL<1> to BL<4>, respectively, by activating the first and second bitline connection signals VSWB11 and VSWB12.

Further, the first connection switch SWC11 is switched to connect electrically the first latch 221 with the second latch 222. The second connection switch SWC12 is switched to connect electrically the third latch 223 with the fourth latch 224. Accordingly, the data of the first bitline BL<1> may be readout to the second latch 222, and the data of the fourth bitline BL<4> may be readout to the third latch 223. Also, the data of the second bitline BL<2> may be readout to the first latch 221, and the data of the third bitline BL<3> may be readout to the fourth latch 224.

Figure 9:
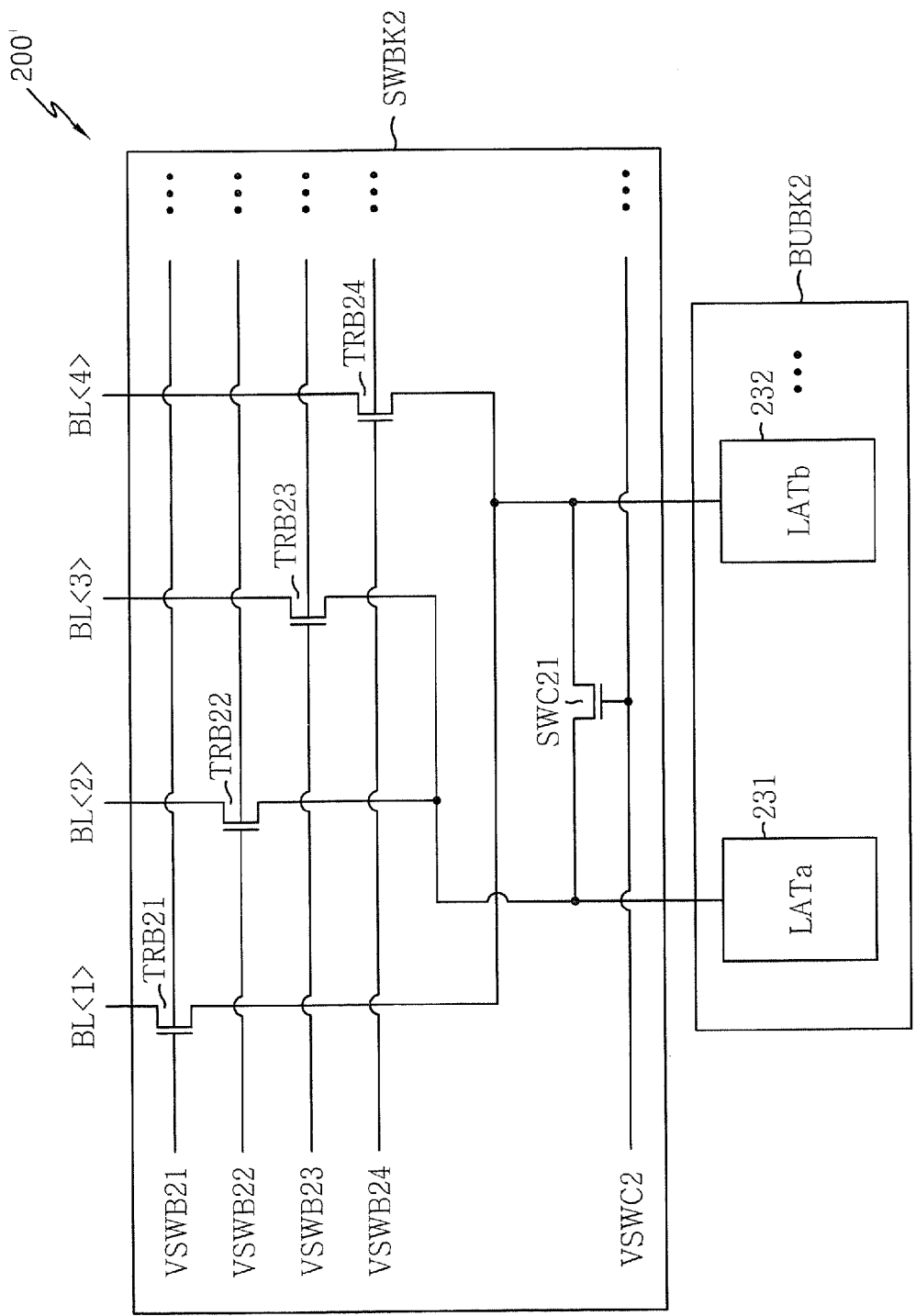
FIG. 9 is a circuit diagram showing another embodiments of he page buffer of FIG. 6.

FIG. 9 is another circuit diagram showing the page buffer 200' of FIG. 6 in detail. Referring to FIG. 9, the page buffer 200' also includes a buffer block BUBK2 and a switch block SWBK2. The buffer block BUBK2 is driven to provide a multiple data during program operations. The switch block SWBK2 is switched to correspondingly provide the multiple data transferred from the buffer block to the first to the fourth bitlines BL<1> to BL<4> during a program operation.

The buffer block BUBK2 includes first and second latches 231 and 232 being driven to provide the multiple data during program operation. The first latch 231 is driven to provide the latched data to the second and the third bitlines BL<2> and BL<3> during program operation. And, the second latch 232 is driven to provide the latched data to the first and the fourth bitlines BL<1> and BL<4> during program operation. Preferably, the first latch 231 is driven to provide the latched data to the second or the third bitlines BL<2> or BL<3>, while the first bit is programmed.

The switch block SWBK2 also includes first to fourth bitline switches TRB21 to TRB24, and also includes a connection switch SWC21. The first bitline switch TRB21 and the fourth bitline switch TRB24 are switched to connect electrically the first bitline BL<1> and the fourth bitline BL<4> to the second latch 232, in response to a first bitline connection signal VSWB21 and a fourth bitline connection signal VSWB24, respectively. The second bitline switch TRB22 and the third bitline switch TRB24 are switched to connect electrically the second bitline BL<2> and the third bitline BL<3> to the first latch 231, in response to a second bitline connection signal VSWB22 and a third bitline connection signal VSWB23, respectively.

The data of the first latch 231 may be transferred to the second and the third bitlines BL<2> and BL<3>. And, the data of the second latch 232 may be transferred to the first and the fourth bitlines BL<1> and BL<4>.

Further, the connection switch SWC21 is switched to connect electrically the first latch 231 with the second latch 232. Accordingly, the data of the first bitline BL<1> and the fourth bitline BL<4> may be readout to the first latch 231, and the data of the second bitline BL<2> and the third bitline BL<3> may be readout to the second latch 232.

Figure 10:
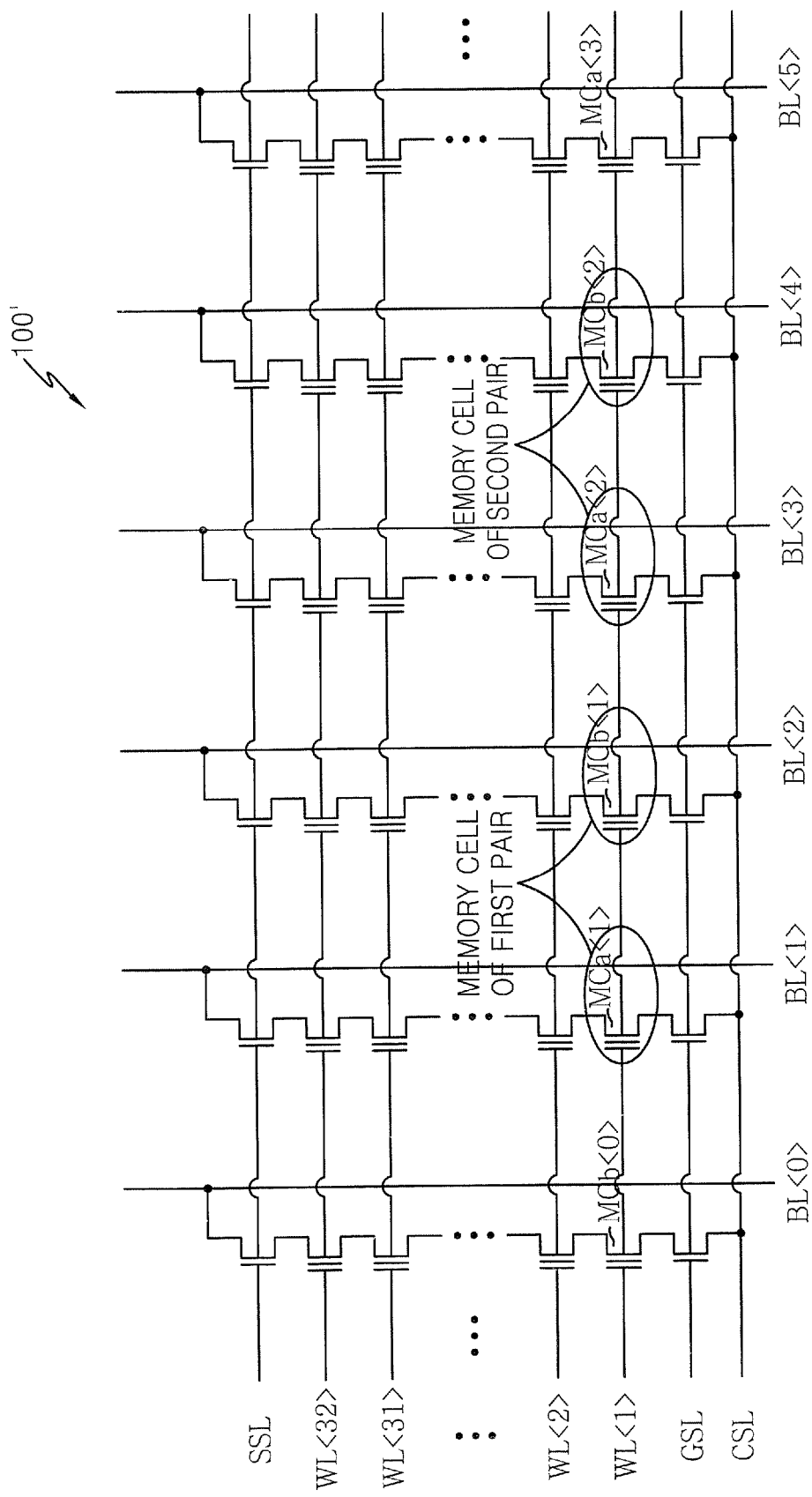
FIG. 10 is an electrical schematic of a memory array that provides a first comparative example relative to the memory array of FIG. 7A.

FIG. 10 is a diagram showing a memory array 100' according to a first example. The memory array 100' shown in FIG. 10 is a NAND-type non-volatile semiconductor memory device. As shown in FIG. 10, the first memory cell MCa<1> of the first pair is connected to the first bitline BL<1>, and the second memory cell MCb<1> of the first pair is connected to the second bitline BL<2>. Further, the first memory cell MCa<2> of the second pair is connected to the third bitline BL<3>, and the second memory cell MCb<2> of the second pair is connected to the fourth bitline BL<4>. In the first example of FIG. 10, at a left side of the first memory cell MCa<1> of the first pair is the second memory cell MCb<0> of the other pair. And, at the right side of the first memory cell MCa<1> of the first pair is the second memory cell MCb<1> of the first pair. In this example, the coupling noise of the worst case is described as follows. In the first example, it is assumed that the first memory cell MCa<1> of the first pair is programmed in the first page program operation STEP1. Then, the worst case of the second page program operation STEP2 may happen when the second memory cell MCb<0> of the other pair is programmed from the first threshold voltage group G1 to the third threshold voltage group G3. In this case, the coupling noise of the worst case is k$\Delta$VC13.

And, the worst case of the third page program operation STEP3 may happen when the second memory cell MCb<1> of the first pair is programmed from the first threshold voltage group G1 to the second threshold voltage group G2. In this case, the coupling noise of the worst case is k$\Delta$VC12. For the reference, the first memory cell MCa<2> of the second pair, which is programmed to the third threshold voltage group G3 in the worst case of the second page program operation STEP2, is not programmed in the third page program operation STEP3. As a result, for the first memory cell MCa<1> of the first pair, the coupling noise of the worst case is the sum of k$\Delta$VC13 and k$\Delta$VC12. The coupling noise in the example of FIG. 10 is relatively large, compared with the embodiment of FIG. 7A.

Figure 11:
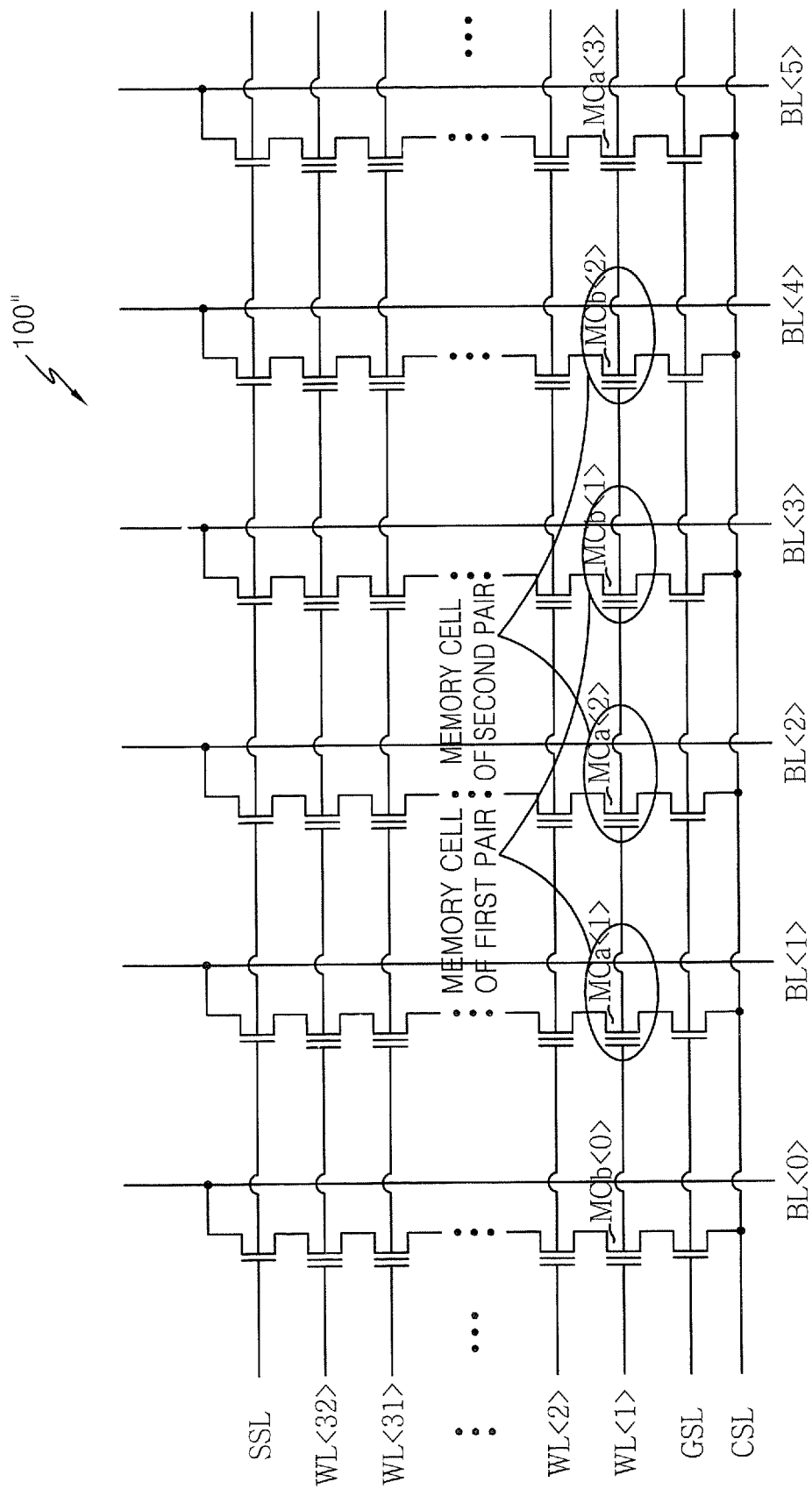
FIG. 11 is an electrical schematic of a memory array that provides a second comparative example relative to the memory array of FIG. 7A.

FIG. 11 is a diagram showing part of a memory array 100'' according to a second example. The memory array shown in FIG. 11 is also a NAND-type non-volatile semiconductor memory device. As shown in FIG. 11, the first memory cell MCa<1> of the first pair is connected to the first bitline BL<1>, and the second memory cell MCb<1> of the first pair is connected to the third bitline BL<3>. Further, the first memory cell MCa<2> of the second pair is connected to the second bitline BL<2>, and the second memory cell MCb<2> of the second pair is connected to the fourth bitline BL<4>. In the second example of FIG. 11, at leftside of the first memory cell MCa<1> of first pair is the second memory cell MCb<0> of the other pair. And, at rightside of the first memory cell MCa<1> of the first pair is the first memory cell MCa<2> of the second pair.

In the second example, the coupling noise of the worst case is described as follows. In the second example, it is supposed that the first memory cell MCa<1> of the first pair is programmed in the first page program operation STEP1. Then, the worst case of the second page program operation STEP2 may happen when the second memory cell MCb<0> of the other pair is programmed from the first threshold voltage group G1 to the third threshold voltage group G3. In this case, the coupling noise of the worst case is k$\Delta$VC13. And, the worst case of the third page program operation STEP3 may happen when the second memory cell MCb<2> of the second pair is programmed from the first threshold voltage group G1 to the second threshold voltage group G2. In this case, the coupling noise of the worst case is k$\Delta$VC12. As a result, for the first memory cell MCa<1> of the first pair, the coupling noise of the worst case is the sum of k$\Delta$VC13 and k$\Delta$VC12. The coupling noise in the example of FIG. 11 is relatively large, compared with the embodiment of FIG. 7A.

Figure 12:
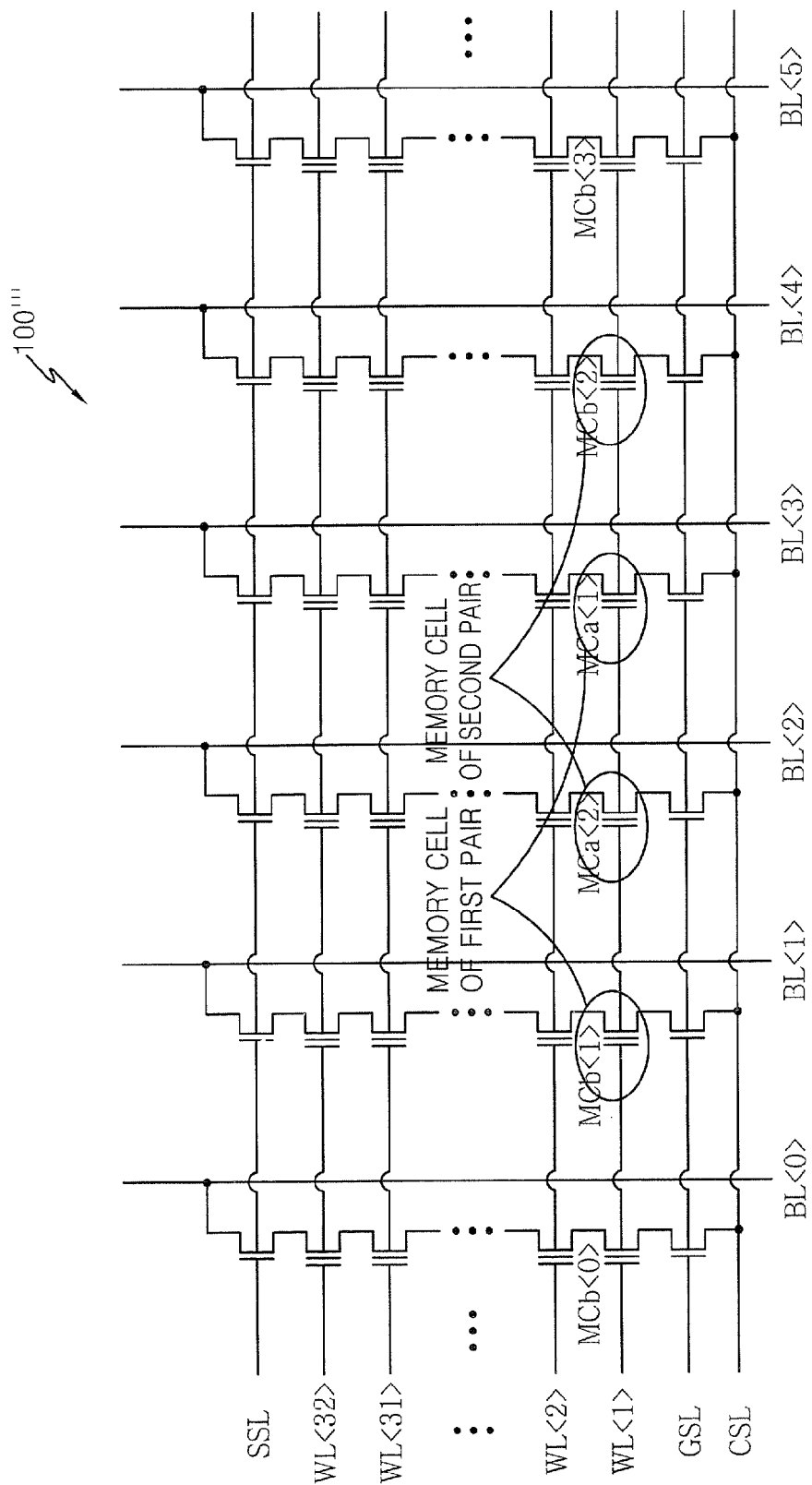
FIG. 12 is an electrical schematic of a memory array that provides a third comparative example relative to the memory array of FIG. 7A.

FIG. 12 is a diagram showing part of a memory array 100''' according to a third example. The memory array shown in FIG. 12 is also a NAND-type non-volatile semiconductor memory device. As shown in FIG. 11, the first memory cell MCa<1> of the first pair is connected to the third bitline BL<3>, and the second memory cell MCb<1> of the first pair is connected to the first bitline BL<1>. Further, the first memory cell MCa<2> of the second pair is connected to the second bitline BL<2>, and the second memory cell MCb<2> of the second pair is connected to the fourth bitline BL<4>. In the third example of FIG. 12, at a left side of the first memory cell MCa<1> of first pair is the second memory cell MCa<2> of the second pair. And, at a right side of the first memory cell MCa<1> of the first pair is the second memory cell MCb<2> of the second pair.

In the third example, the coupling noise of the worst case is described as follows. In the third example, it is supposed that the first memory cell MCa<1> of the first pair is programmed in the first page program operation STEP1. Then, the worst case of the second page program operation STEP2 may happen when the second memory cell MCb<2> of the second pair is programmed from the first threshold voltage group G1 to the third threshold voltage group G3. In this case, the coupling noise of the worst case is k$\Delta$VC13.

And, the worst case of the third page program operation STEP3 may happen when the second memory cell MCa<2> of the second pair is programmed from the first threshold voltage group G1 to the second threshold voltage group G2. In this case, the coupling noise of the worst case is k$\Delta$VC12.

As a result, for the first memory cell MCa<1> of the first pair, the coupling noise of the worst case is the sum of k$\Delta$VC13 and k$\Delta$VC12. The coupling noise in the example of FIG. 12 is relatively large, compared with the embodiment of FIG. 7A.

FIG. 13 is a table showing the worst case coupling noises for the embodiment of FIG. 7A and the comparative examples of FIGS. 10-12. As shown in FIG. 13, the coupling noise of the worst case is the sum of k$\Delta$VC23 and k$\Delta$VC12 in case of the embodiment of FIG. 7A. This is relatively small, compared with the examples of FIG. 10 to FIG. 12.

As described above, the non-volatile semiconductor memory device according to embodiments of the invention includes memory cells, which can be controlled to three threshold voltage levels, and a page buffer for controlling the memory cells. The non-volatile semiconductor memory device can have a higher degree of integration than a 2-level non-volatile semiconductor memory device. Further, the non-volatile semiconductor memory device typically has higher reliability than a 4-level non-volatile semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the technical scope of the present invention must be defined by the accompanying claims.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A non-volatile memory device, comprising:
    a memory array having at least one row of three-state memory cells therein that are grouped in pairs to provide 3-bit data storage per pair, said at least one row comprising a first pair of first and second non-volatile memory cells extending immediately adjacent a second pair of first and second non-volatile memory cells; and
    a program control circuit electrically coupled to said memory array, said program control circuit configured to support mirror-image programming of the first and second pairs of non-volatile memory cells so that the threshold voltages in the first and second non-volatile memory cells of the first pair are mirror images of the threshold voltages in the first and second non-volatile memory cells of the second pair whenever the first and second pairs of non-volatile memory cells are storing the same 3-bit data containing at least one programmed bit and the threshold voltages of the first and second non-volatile memory cells in each of the first and second pairs of non-volatile memory cells are unequal; said program control circuit further configured to concurrently drive two pairs of bit lines associated with the first and second pairs of non-volatile memory cells in said memory array with bit line voltages during said mirror-image programming and readout data from the first and second pairs of non-volatile memory cells by concurrently transferring data from the first and second pairs of non-volatile memory cells to the two pairs of bit lines.

2. A method of programming a non-volatile memory array, comprising the step of:
    programming first and second pairs of immediately adjacent 3-level non-volatile memory cells within a row of the non-volatile memory array at the same time during a mirror-image programming operation so that the threshold voltages in first and second non-volatile memory cells of the first pair are mirror-images of the threshold voltages in first and second non-volatile memory cells of the second pair whenever the first and second pairs of non-volatile memory cells are storing the same 3-bit data containing at least one programmed bit and the threshold voltages of the first and second non-volatile memory cells in each of the first and second pairs of non-volatile memory cells are unequal.

3. The device of claim 1, wherein said program control circuit comprises:
    a page buffer electrically coupled to the two pairs of bit lines, said page buffer configured to map three bits of first data to the first pair of non-volatile memory cells and map three bits of second data to the second pair of non-volatile memory cells; and
    wherein said program control circuit is further configured so that a threshold voltage of the first non-volatile memory cell in the first pair of non-volatile memory cells is controlled by a value of a first bit of the three bits of first data and a threshold voltage of the second non-volatile memory cell in the second pair of non-volatile memory cells is controlled by a value of a first bit of the three bits of second data.

4. The device of claim 3, further comprising:
    a row decoder electrically coupled to a word line in said memory array; and
    wherein the word line is electrically coupled to the first and second pairs of non-volatile memory cells.

5. The device of claim 3, wherein said page buffer comprises:
    a buffer block configured to concurrently drive the two pairs of bit lines with data during the mirror-image programming; and
    a switch block configured to pass the data from said buffer block to the two pairs of bit lines during the mirror-image programming.

6. The device of claim 5, wherein said buffer block comprises first through fourth latches configured to store the data.

7. The device of claim 6, wherein the second and third latches in said buffer block are configured to dump data to respective bit lines in the two pairs of bit lines during the mirror-image programming of the first non-volatile memory cell in the first pair of non-volatile memory cells and the second non-volatile memory cell in the second pair of non-volatile memory cells.

8. The device of claim 6, wherein said switch block comprises:
    first through fourth bit line switches configured to electrically connect respective outputs of the first through fourth latches to the two pairs of bit lines when enabled;
    a first connection switch configured to electrically connect an output of the first latch to an output of the second latch when enabled; and
    a second connection switch configured to electrically connect an output of the third latch to an output of the fourth latch when enabled.

9. The device of claim 5, wherein said buffer block comprises:
    a first latch configured to concurrently drive a second bit line in the first of the two pairs of bit lines and a third bit line in the second of the two pairs of bit lines during the mirror-image programming; and
    a second latch configured to concurrently drive a first bit line in a first of the two pairs of bit lines and a fourth bit line in a second of the two pairs of bit lines during the mirror-image programming.

10. The device of claim 9, wherein said switch block comprises:
    second and third bit line switches configured to electrically connect an output of said first latch to respective ones of the second and third bit lines when enabled;
    first and fourth bit line switches configured to electrically connect an output of said second latch to respective ones of the first and fourth bit lines when enabled; and
    a connection switch configured to electrically connect an output of said first latch to an output of said second latch when enabled.

11. The device of claim 3, wherein the non-volatile memory device is a NAND-type memory device.

12. The programming method for a non-volatile semiconductor memory device according to claim 2,
    wherein the programming step comprises:
    A) step of controlling the threshold voltage of the first memory cell of the first pair as a first threshold group depending on first bit data of a first group, and controlling the threshold voltage of the first memory cell of the second pair as the first threshold group depending on first bit data of a second group;

B) step of controlling one of the first memory cell and the second memory cell of the first pair as a third threshold group according to the combination second bit data of the first group and the threshold voltage of the first memory cell of the first pair programmed at A) step, and controlling one of the first memory cell and the second memory cell of the second pair as a third threshold group depending on the combination second bit data of the second group and the threshold voltage of the first memory cell of the second pair programmed at A) step; and C) step of controlling the other one of the first memory cell and the second memory cell of the first pair as a second threshold group according to the combination third bit data of the first group and the threshold voltages of the first memory cell and the second memory cell of the first pair programmed at B) step, and controlling the other one of the first memory cell and the second memory cell of the second pair as the second threshold group depending on the combination third bit data of the second group and the threshold voltages of the first memory cell and the second memory cell of the second pair programmed at B) step, wherein the first to the third threshold voltage groups are sequentially increased, wherein the first memory cell of the first pair is connected to a second bitline, and the second memory cell of the first pair is connected to a first bitline, and the first memory cell of the second pair is connected to a third bitline, the second memory cell of the second pair is connected to a fourth bitline, and the first to the fourth bitlines are sequentially arranged.

* * * * *